(12) United States Patent
Textor et al.

(10) Patent No.: US 11,734,024 B2
(45) Date of Patent: Aug. 22, 2023

(54) DEVICE FOR MANAGING DIGITAL TWINS

(71) Applicant: Robert Bosch GmbH, Stuttgart (DE)

(72) Inventors: Andreas Textor, Weinstadt-Beutelsbach (DE); Steffen Stadtmueller, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/456,938

(22) Filed: Nov. 30, 2021

(65) Prior Publication Data

US 2022/0171633 A1 Jun. 2, 2022

(30) Foreign Application Priority Data

Dec. 2, 2020 (DE) ...................... 10 2020 215 230.6

(51) Int. Cl.
*G06F 9/448* (2018.01)
*H04L 67/125* (2022.01)
*G06F 30/20* (2020.01)

(52) U.S. Cl.
CPC ............ *G06F 9/4492* (2018.02); *G06F 30/20* (2020.01); *H04L 67/125* (2013.01); *G06F 9/4494* (2018.02)

(58) Field of Classification Search
CPC ...... G06F 9/4492; G06F 9/4494; G06F 30/20; H04L 67/125
See application file for complete search history.

(56) References Cited

U.S. PATENT DOCUMENTS

2017/0285623 A1* 10/2017 Figoli ................. G06F 13/4068
2018/0335907 A1* 11/2018 Mohan ..................... G06F 30/00
2019/0354922 A1* 11/2019 Berti ................... G06F 21/6209

FOREIGN PATENT DOCUMENTS

DE            4039738 A1    6/1991
DE       102018205872 A1   10/2019
GB            2454583 A  *  5/2009   ....... H04L 29/08108

OTHER PUBLICATIONS

Chakrabarty, Shaibal, et al., Consumer Frameworks for Smart Environments, 2020 IEEE 10th International Conference on Consumer Electronics (ICCE-Berlin), Nov. 2020, 5 pages, [retrieved on Mar. 30, 23], Retrieved from the Internet: <URL:http://ieeexplore.ieee.org/>.*
Digital Twin, Wikipedia, Nov. 2020, 15 pages, [retrieved on Mar. 30, 2023], Retrieved from the Internet: <URL:http://ieeexplore.ieee.org/>.*

\* cited by examiner

*Primary Examiner* — Geoffrey R St Leger
(74) *Attorney, Agent, or Firm* — Norton Rose Fulbright US LLP; Gerard Messina (57) ABSTRACT

A data integration device, including input interfaces to which a device which delivers runtime data to the input interface is connectable in each case. The runtime data of the particular device are characterized with the aid of at least one aspect model that is associated with the particular input interface and that characterizes in each case an aspect of the runtime data. The particular input interface is associated with the particular aspect model.

24 Claims, 7 Drawing Sheets

```
{ operating temperature   :   {
                              internal : 600,0
                              external : 35,6
                              }
  power consumption       : 35000 }
```

DEVICE FOR MANAGING DIGITAL TWINS

FIELD

The present invention relates to a data integration device.

BACKGROUND INFORMATION

A method for generating a digital twin of a physical object is described in German Patent Application No. DE 10 2018 205 872 A1, in which description data containing properties of digital data are generated based on a description meta-model. In addition, communication information is created. The description data, the communication information, and a description of the physical object are combined to generate the digital twin.

SUMMARY

Example embodiments of the present invention may have the advantage over the related art that it enables a flexible system that may process run time data from a plurality of heterogeneous data sources without additional communication effort and provide the run time data in a standardized manner.

Further aspects of the present invention are disclosed herein. Advantageous refinements are the subject matter are disclosed herein.

Specific embodiments of the present invention are explained in greater detail below with reference to the figures.

DETAILED DESCRIPTION OF EXAMPLE EMBODIMENTS

Figure 1:
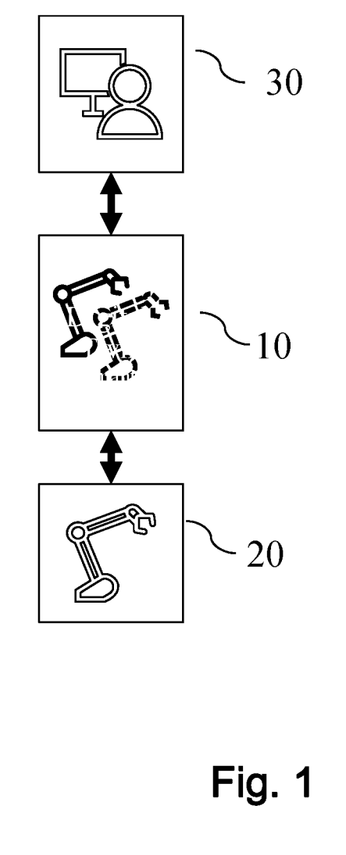
FIG. 1 shows an example of a use of the present invention.

FIG. 1 shows an example of a use of the present invention. A data integration device 10 is provided for being coupled to devices 20 and client-side devices 30. Device 20 may be, for example, a sensor and/or an ERP system and/or a production machine such as a blast furnace and/or a robot, for example a welding robot, and/or a vehicle and/or a charging station, for example for an electric vehicle. Coupled devices 20 are configured to transfer information to data integration device 10.

Client-side devices 30 may be, for example, reproducing devices or also devices that access devices 20 for control of same.

Figure 2:
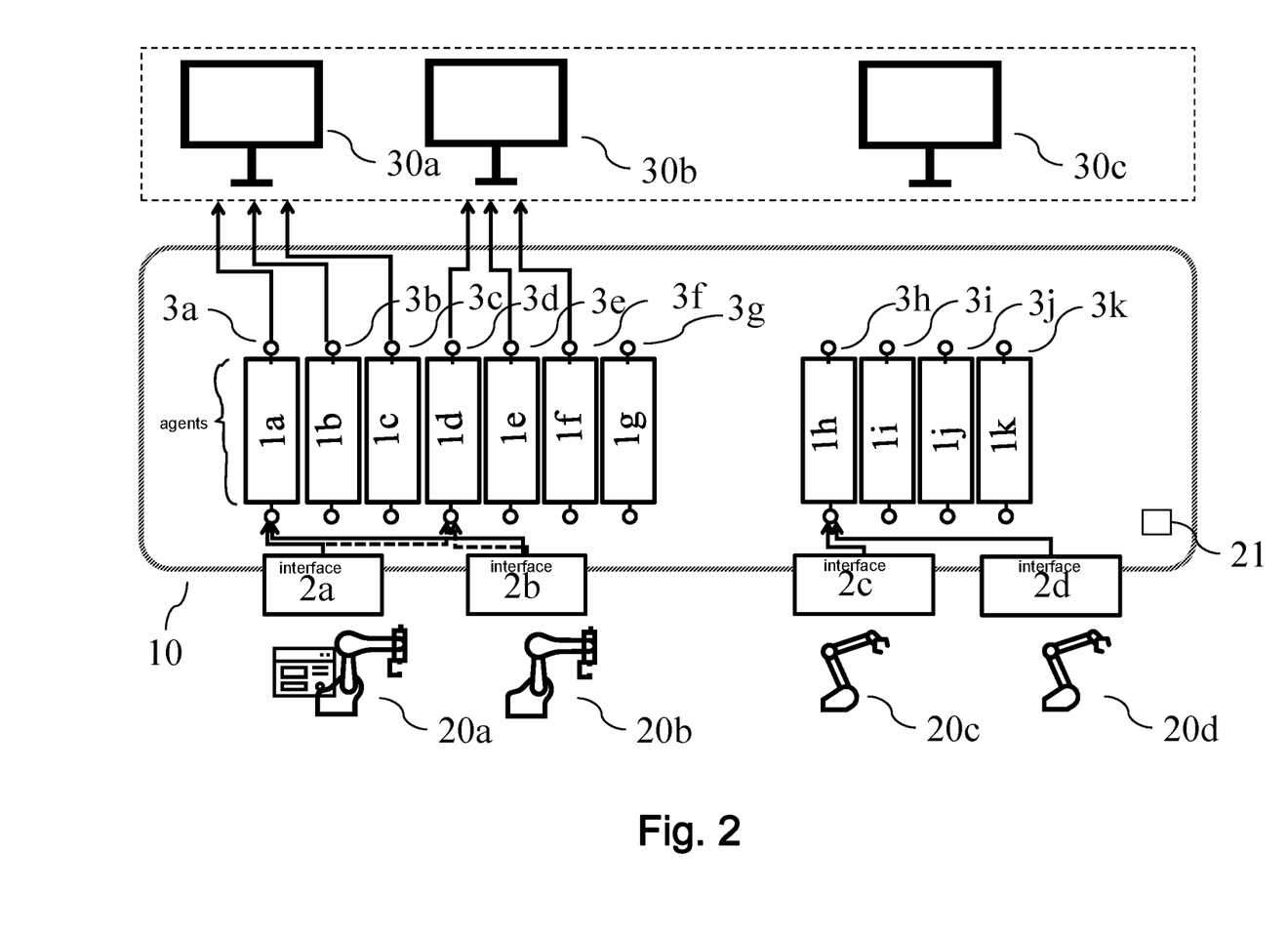
FIG. 2 schematically shows data flows through the data integration device, in accordance with an example embodiment of the present invention.

FIG. 2 shows, in one exemplary embodiment, how the data flows through data integration device 10 take place. Devices 20a . . . d are coupled to data integration device 10 via a respective input interface 2a . . . 2d. Each of data integration devices 10 is connected to one or multiple aspect agents 1a . . . k (also referred to as aspect processing devices), it being possible for different coupled devices 20a . . . d to be connected, via their respective input interfaces 2a . . . d, to same aspect agents 1a . . . k.

It may thus be provided that a plurality of input interfaces 2a, . . . , 2d are connected to same aspect processing device 1a, . . . , 1k. Alternatively or additionally, it may be provided that a plurality of aspect models $AM_1$, $AM_2$ are associated with at least one input interface 2a, . . . , 2d, and/or that at least one input interface 2a, . . . , 2d is connected to a plurality of aspect processing devices 1a, . . . , 1k.

The aspect agents are referred to as first 1a, second 1b, third 1c, fourth 1d, fifth 1e, sixth 1f, seventh 1g, eighth 1h, ninth 1i, tenth 1j, and eleventh 1k aspect agent. Each aspect agent includes a respective output interface 3a . . . 3k, which with the same numbering as the aspect agents is referred to as first 3a, second 3b, third 3c, fourth 3d, fifth 3e, sixth 3f, seventh 3g, eighth 3h, ninth 3i, tenth 3j, and eleventh 3k output interface, first aspect agent 1a including first output interface 3a, the second aspect agent including the second output interface, etc.

In the illustrated exemplary embodiment, a first device 20a is coupled to first aspect agent 1a and to fourth aspect agent 1d via a first input interface 2a, and a second device 20b is likewise coupled via a second input interface 2b.

A third device 20c is coupled to ninth aspect agent 1h via a third input interface 2c. Likewise, a fourth device 20d is coupled via a fourth input interface 2d.

Input interfaces 2a . . . d are each configured to receive data of devices 20a . . . d, to which they are respectively connected, in a specific format for particular connected device 20a . . . d.

One or multiple (semantic) aspect models $AM_1$, $AM_2$ (cf. FIG. 3) are stored in a dedicated location in a memory 21, a so-called model repository, that is associated with data integration device 10. Data integration device 10 may access these aspect models $AM_1$, $AM_2$. For each aspect agent 1a . . . k, a reference to an aspect model $AM_1$, $AM_2$ that is associated with this particular aspect agent 1a . . . k is stored. Each of aspect models $AM_1$, $AM_2$ describes at least a portion of the properties of the data received from particular data-transmitting device 20a . . . 20d that is connected via one of input interfaces 2a . . . 2d. It may thus be provided that aspect model $AM_1$, $AM_2$ includes a semantic description of the runtime data that are present at particular input interface 2a, . . . , 2d, the semantic description including a description of a data type of the runtime data and/or a description of an allowable value range of values contained in the runtime data and/or a description of a physical unit of the parameter that is described by values contained in the runtime data.

Each of aspect models $AM_1$, $AM_2$ may be associated with a plurality of aspect agents 1a . . . 1k due to the storing in the model repository.

Each of aspect agents 1a . . . 1k is configured to receive data from respective connected data-transmitting device 20a . . . 20d and to provide at least a portion of the data to output interface 3a . . . 3k of the aspect agent.

Aspect models $AM_1$, $AM_2$ each describe, for example, the structure of at least a portion of the data provided by particular aspect agent 1a . . . k that references this aspect model $AM_1$, $AM_2$, and/or properties of the data provided by this aspect agent 1a . . . k.

The properties of the described data include, for example, data types, possible or allowable value ranges, and/or a physical unit, which represent the particular data.

The particular data received from data-transmitting device $20a \ldots d$ are provided to output interfaces $3a \ldots k$ and are retrievable there. A reference to one or multiple corresponding aspect models $AM_1$, $AM_2$ is also associated with each output interface $3a \ldots k$. Those data of data-transmitting device $20a \ldots d$ for which descriptions are present in respective associated aspect models $AM_1$, $AM_2$ are retrievable via output interface $3a \ldots k$.

Each aspect model $AM_1$, $AM_2$ thus describes a data structure via which associated output interface $3a \ldots k$ allows access to the portions of the data defined by aspect model $AM_1$, $AM_2$ in each case, and provides descriptive information for this purpose.

First output interface $3a$, second output interface $3b$, and third output interface $3c$ are connected to a first terminal $30a$, for example a monitor for displaying the data received via the connected output interfaces, or to a data processing device that further processes the received data, for example stores them in a database.

As a result of the data, to which output interface $3a \ldots k$ provides access, being provided by associated aspect model $AM_1$, $AM_2$, homogeneous access to the data occurs, even though different devices $20a \ldots d$ may be connected to input interface $2a \ldots d$.

Figure 3:
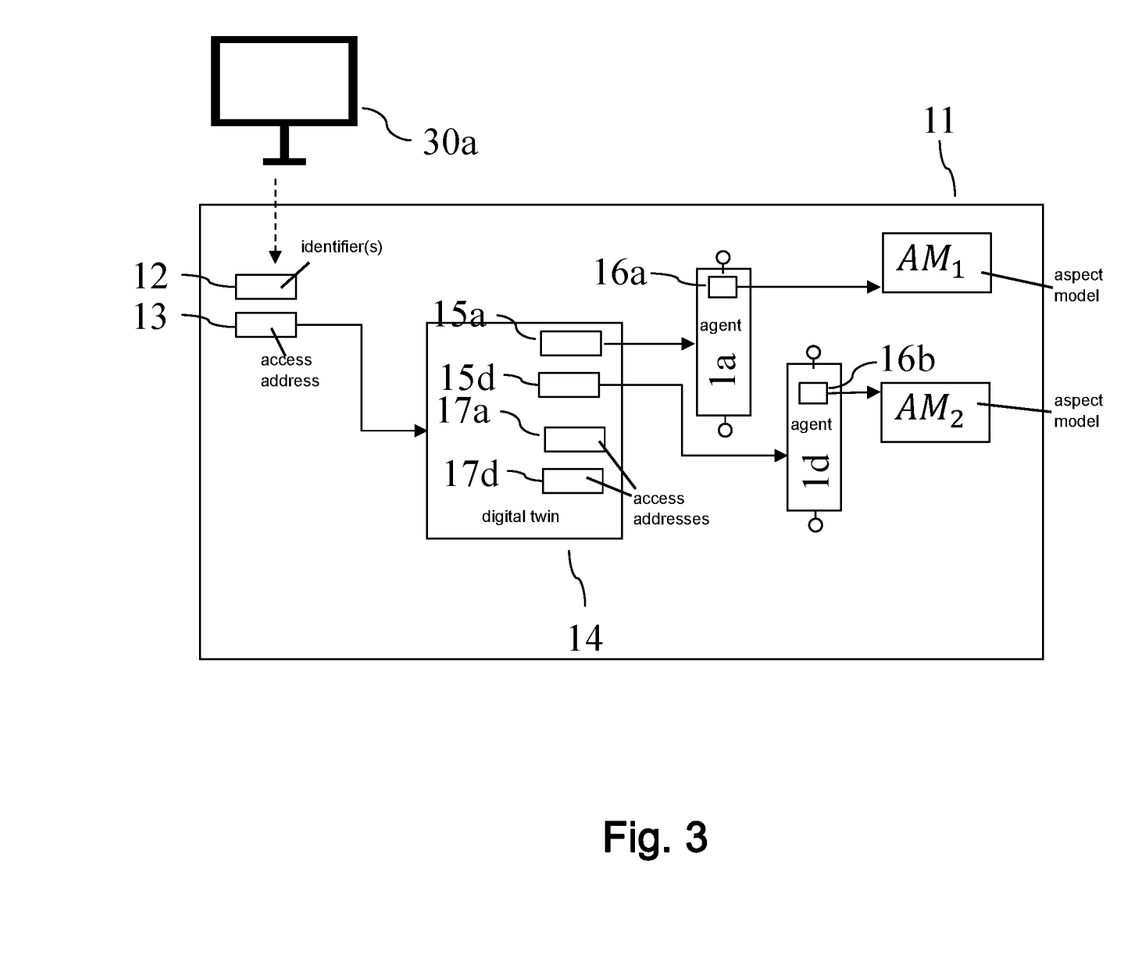
FIG. 3 schematically shows a mechanism for coupling a data-transmitting device, in accordance with an example embodiment of the present invention.

FIG. 3 illustrates a mechanism for coupling a data-transmitting device, in the present case, the coupling of first device $20a$. For the coupling, a digital twin 14 of first device $20a$ is applied (in particular, such a digital twin is provided for each coupled device) and provided under an access address 13. This takes place based on predefinable aspect agents $1a \ldots 1k$, as illustrated here in FIG. 2 by way of example, based on first aspect agent $1a$ and fourth aspect agent $1d$.

For this purpose, one or multiple identifiers 12 of first device $20a$ to be coupled are stored in a registry 11, which may be stored in memory 21, for example, as well as access addresses $17a$, $17d$ at which output interfaces $3a \ldots 3k$ that are associated with aspect agent $1a \ldots k$ may be accessed, and that are associated with the device to be coupled, in the present case, first device $20a$. In the exemplary embodiment, access addresses $17a$, $17b$ address first output interface $3a$ and fourth output interface $3b$.

In addition, for each output interface $3a$, $3d$, i.e., each aspect agent $1a$, $1d$, a reference $16a$, $16b$ to descriptive aspect model $AM_1$, $AM_2$ provided in the model repository is provided in registry 11.

The topology may of course differ. In particular, it is possible for a data structure, for example a table, that is filterable according to identifiers 12 to be stored in the registry.

If a terminal $30a$ is now to carry out an action, predefinable by the user, on first device $20a$ in the example, the data delivered by first device $20a$ via first input interface $2a$ are retrievable at first output interface $3a$ and fourth output interface $3d$ via access addresses $17a$, $17b$, in conjunction with stored aspect models $AM_1$, $AM_2$, which in each case describe a partial aspect of the delivered data.

Figure 4:
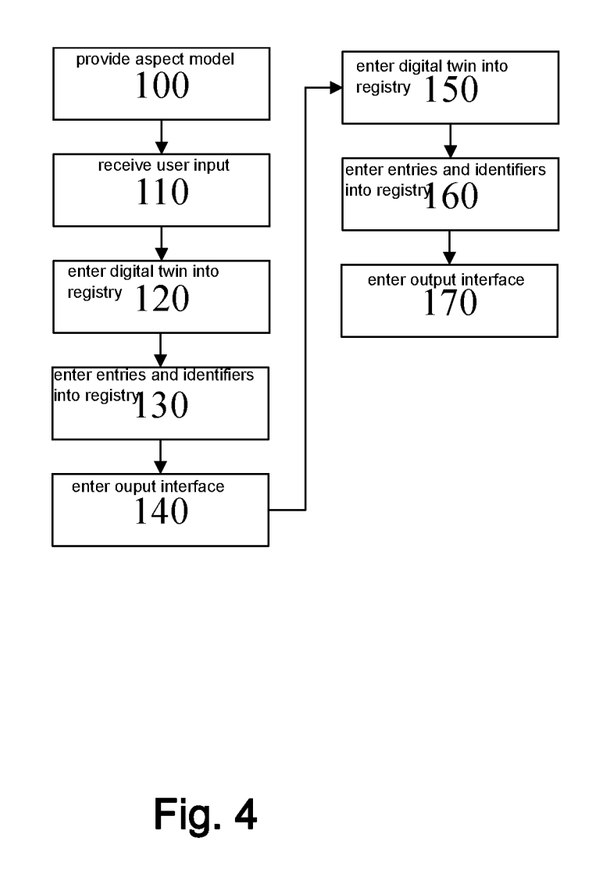
FIG. 4 shows in a flowchart an example of a method for providing a digital twin, in accordance with the present invention.

FIG. 4 illustrates in a flowchart an example of a method for providing a digital twin 14 together with aspect agents $1a \ldots k$ and their use, using the example of a blast furnace and a welding robot as data-transmitting devices $20a \ldots d$ to be coupled.

An aspect model $AM_1$, $AM_2$ for maintenance information is initially provided 100 in the model repository by a user, for example a maintenance engineer.

A user input that accesses this provided aspect model $AM_1$, $AM_2$ is then received 110. An aspect agent $1a \ldots k$ is then generated, in particular automatedly, and is configured to receive data from the blast furnace, select maintenance data contained therein, optionally transform same, and provide the maintenance data to output interface $3a \ldots k$ of the aspect agent.

The entry of a separate digital twin 14 into registry 11 subsequently takes place 120 for each blast furnace of this type to be connected.

In particular, an entry or multiple entries in the registry together with identifiers of the particular connected blast furnace may be added 130 to each digital twin. This allows the traceability of which devices $20a \ldots d$ provide an aspect agent $1a \ldots k$ with data.

In general, the digital twin may be a separately maintained data structure, but it is also possible for the digital twin to be embedded in a larger data structure. It is thus possible, for example, for the pieces of information that make up the digital twin to be aggregated in a list. Thus, the digital twin of a predefinable connected device may then be provided, for example by filtering the list according to the indicator of the predefinable connected device.

For each digital twin 14 in registry 11, an entry 140 of output interface $3a \ldots k$ for particular aspect agent $1a \ldots k$, i.e., the maintenance aspect model in this case, subsequently takes place.

The blast furnace is coupled in this way.

A different user may likewise subsequently access this aspect model $AM_1$, $AM_2$, and may generate an aspect agent that collects data from a welding robot, appropriately selects maintenance data, transforms same, and provides the data to the output interface.

Initially a step 150 follows that is analogous to step 120. Step 160 then follows, which is analogous to step 130. Step 170 then follows, which is analogous to step 140.

In this example, a computer program that accesses this maintenance aspect model may now be provided for planning maintenance operations. This computer program may now be used for blast furnaces as well as for welding robots. This computer program may access registry 11 as described.

Particular aspect model $AM_1$, $AM_2$ follows the rules of a metamodel. In particular, aspect model $AM_1$, $AM_2$ is structurally a directed graph, in which nodes represent, describe, and identify individual data points (so-called properties) and groups of data points, which are provided to output interface $3a \ldots k$ of an aspect agent $1a \ldots k$.

The structure of the directed graph (i.e., the links between the nodes of the data points and the data point groups) thus allows the unambiguous derivation of the structure of the (runtime) data that are provided to output interface $3a \ldots k$ of aspect agent $1a \ldots k$.

In addition, an aspect model $AM_1$, $AM_2$ graph contains one or multiple subgraphs (so-called characteristics) that establish the properties (data type, value range, physical unit, etc.) of the represented data points, during traversal of the graph up to a predefinable data point at least one or multiple such characteristic subgraphs also being unambiguously reachable for the data point. This is important, since the (runtime) data provided by an aspect agent have the predefined properties and must be interpreted accordingly. It is thus possible to unambiguously ascertain and provide these properties during the traversal.

Figure 5:
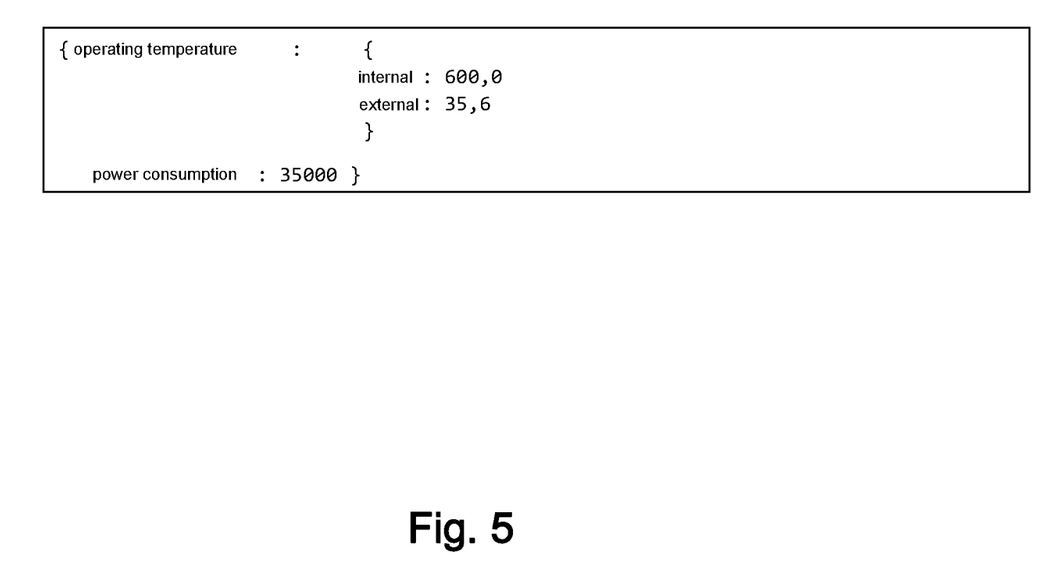
FIG. 5 shows an example of data of a blast furnace provided by an aspect agent, in accordance with the present invention.

FIG. 5 illustrates an example of data of a blast furnace provided by an aspect agent $1a \ldots k$. These data include data concerning the internal and external operating temperatures and the present power consumption of the furnace.

Two data points with the identifiers "power consumption" and "operating temperature" are initially described. Whereas power consumption has a scalar value "35,000," the value of "operating temperature" is a complex object which in turn contains two further data points: "internal" and "external" with the respective scalar values "600.0" and "35.6."

Figure 6:
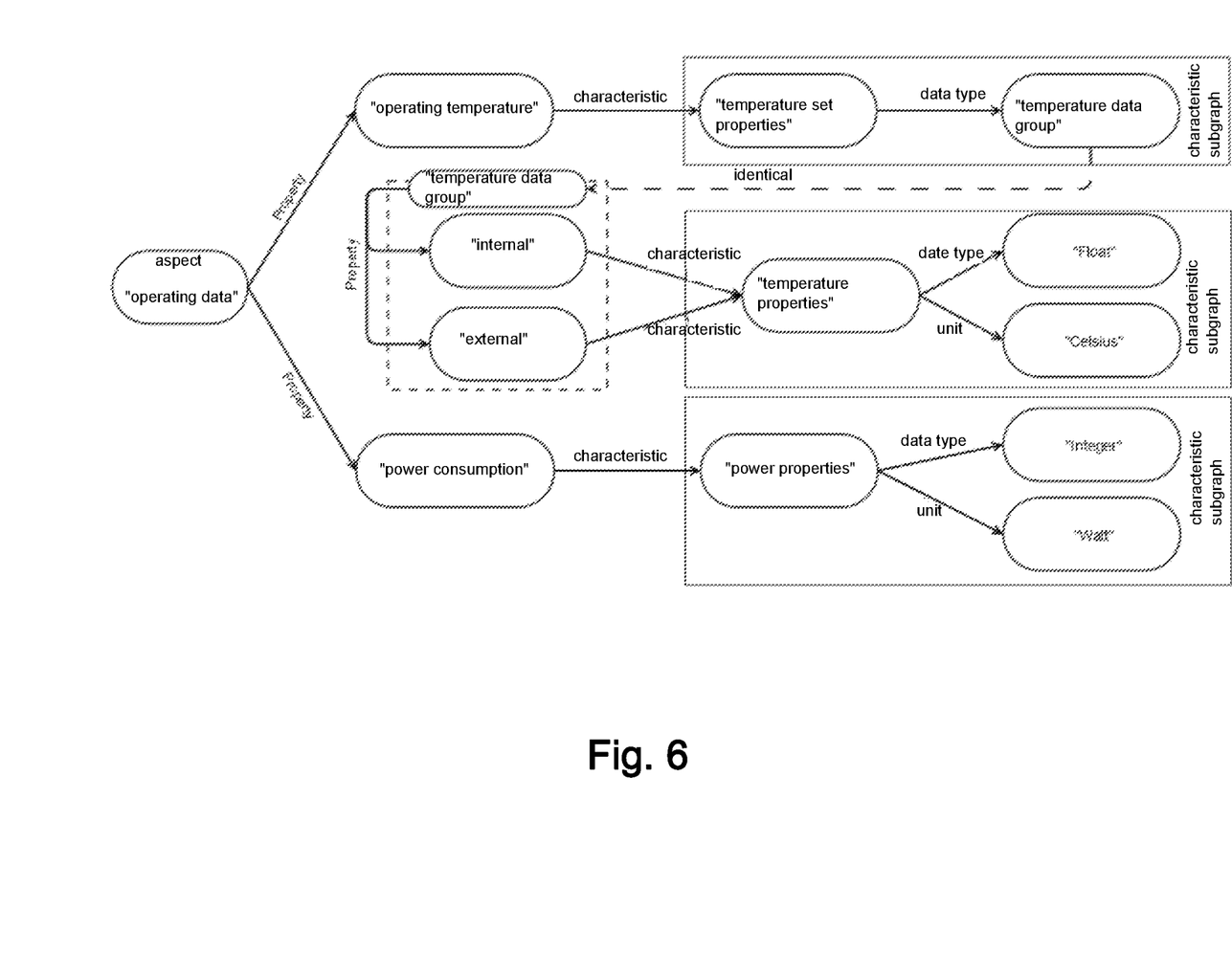
FIG. 6 shows an example of an aspect model for this aspect agent, in accordance with the present invention.

FIG. 6 shows an example of an aspect model for this aspect agent. The identifiers of the data points, i.e., "operating temperature" and "power consumption," each point to a characteristic subgraph which establishes properties with regard to data type and, if possible, its physical unit. The complex data type for "operating temperature" is likewise defined in the aspect model. This takes place by providing the contained data points. The values of the data points are not present in the aspect model, since they are not provided until runtime, and may continuously change.

Lastly, it is also possible that accesses to runtime data may be predefined from terminal $30a \ldots c$ at the output interface via so-called "operations," or that access to information takes place via the runtime data, or that an access to functions takes place via which the connected device may be activated.

It is likewise possible to define an operation in the aspect model as a function that may be called up (for example, "turn on blast furnace" or "turn off blast furnace"). Such an operation may require input data, and may deliver output data. These data may likewise be described in the aspect models, the properties of the represented data points of the input/output data likewise being described using characteristic subgraphs. These input/output data may or may not be part of the data which are otherwise also retrievable.

For example, an "operating state aspect model" of the furnace contains the representation of a data point "status," the characteristic subgraph describing two possible values as a value range: "on" or "off." In addition, the operating state aspect model may indicate the operation "turn on," whose output data likewise contain the representation of the data point "status."

An aspect agent that follows an aspect model using operations must thus provide for the call-up of these operations at its "output interface" as an input interface for the information flow in the opposite direction.

The properties that may be established by the characteristic subgraphs within an aspect model in order to describe the data points represented in the aspect model are predefined by a metamodel. The properties that are usable for the description are subdivided into classes. These classes are predefined in a hierarchical structure for describing a represented data point of selectable classes.

In addition, establishing the possible properties for describing the data points in a class hierarchy allows the creation of aspect models in an editor, which allows the users to easily select the elements that are available for the description.

Figure 7:
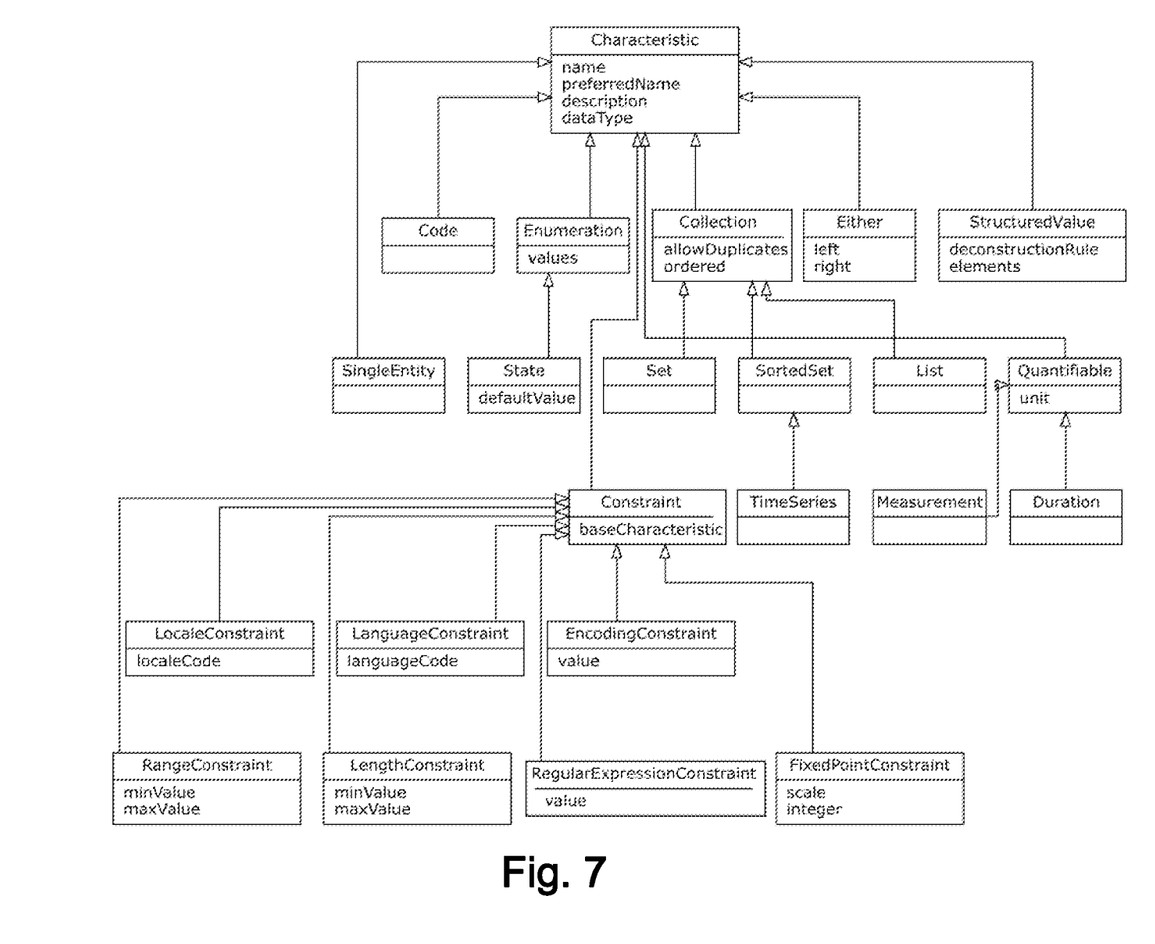
FIG. 7 shows an example of a class hierarchy for establishing properties of subgraphs of the aspect model.

One example of such a class hierarchy is illustrated in FIG. 7, where "A→B" means that class A is a class that is derived from class B. It is important that the hierarchical configuration represents inheritance relationships in an "is a" relationship; i.e., descriptive properties that may be represented by class B in an aspect model may likewise be represented by class A, it being possible to additionally represent further properties in class A. The classes are thus expandable in a particularly simple manner.

The class hierarchy illustrated by way of example in FIG. 7 is used to establish, as an example, usable properties in characteristic subgraphs. By use of this example of a hierarchy, the characteristic subgraphs from the aspect model illustrated in FIG. 6 by way of example may be associated with the following classes:

The temp-set properties are from the single entity class, the temperature properties are from the measurement class, and the power properties are likewise from the measurement class.

The specific forms of the characteristic subgraphs are instances of the classes provided in the class hierarchy.

Predefining a hierarchical structure of classes in a metamodel with properties for the data point description is a prerequisite for using the aspect models that follow the metamodel.

For example, an aspect agent $1a \ldots k$ may be created automatedly from existing aspect models.

Alternatively or additionally, evaluation functions (more precisely: a program code of this evaluation function) may be generated for the automated processing of data that are provided by aspect agents $1a \ldots k$ at their respective output interface $3a \ldots k$.

Alternatively or additionally, the evaluation functions may be parameterized using aspect models.

Alternatively or additionally, descriptions in Interface Description Language (IDL) may be generated from provided aspect models. These descriptions may in turn be used to enable an application to consume the data that are provided by the particular aspect agent.

Alternatively or additionally, it is possible to generate semantic descriptions in ontology formats or logic formats, such as Web Ontology Language (OWL) or Common Logic (CL), from existing aspect models. It is thus possible to integrate the data provided by an aspect agent as well as the corresponding aspect models into a structured database such as a knowledge graph.

Alternatively or additionally, specialized or technical descriptions may be generated from provided aspect models, which in textual and graphical form describe the semantics of the aspect model in the particular domain, the description containing the structure of the data provided by aspect agent $1a \ldots k$ at its output interface $3a \ldots k$, and in addition including the classification into the specialized context and the linkage to elements from particular standards and norms that are relevant in each case.

These types of fragments, i.e., evaluation functions or descriptions, may be generated from provided aspect models according to one of the methods described below.

One specific embodiment of the first such method provides that the graph of the aspect model is (preferably recursively) traversed. In addition, a mapping function is applied which generates a suitable subelement of the target format from the particular element of the aspect model, taking the associated semantics of the metamodel into account.

In the case of the evaluation function, the subelements are classes or functions, for example.

For example, for generating an application for monitoring operating data for blast furnaces, a mapping function may be defined during production, according to which all data points that are described by a characteristic subgraph, which is one instance of the measurement class, are mapped onto a predefinable class. In addition, the generated classes then automatically allow access to the unit of the data point having a predefined function, as illustrated by way of example in the following lines of pseudocode.

Property(Characteristic.class=Quantifiable)→ Class<Property.name>

(Characteristic.class=Quantifiable).unit→Function:getUnit( )

By applying these mapping functions to aspect model 1 illustrated in conjunction with FIG. 6, using the class hierarchy illustrated by way of example in conjunction with FIG. 7, the following three program code classes may then be generated:

temperature.internal
temperature.external
power consumption

Since the measurement class corresponding to the hierarchy established in FIG. 8 by way of example is also a "quantifiable," the data points "temperature.internal" and "temperature.external" may be recognized as relevant for the mapping condition.

Each of the generated program code classes allows access to the particular physical unit (degrees Celsius or watts) by calling up predefined function .getUnit( ).

The program code classes generated in this way allow display of the data, provided at output interface $3a \ldots k$ of aspect agent $1a \ldots k$, which provides data corresponding to the aspect model, with an automatic, correct display of the physical unit of the represented values.

In addition, the same application may display other arbitrary data points (having a quantifiable characteristic) of other aspect agents by analogous automated generation of further program code classes for the corresponding aspect models.

A more specific use of the semantics of the elements in the aspect model is likewise possible, for example by configuration by the user of the application, which may establish, for example, that data points according to the "temperature properties" characteristic are to be represented in a predefinable graphical form, for example in the form of a thermometer, or data points of the "power properties" characteristic are to be represented by a level display.

One specific embodiment of a second method for generating the evaluation functions or descriptions provides, for each target format, for the provision of a set of patterns which may recognize subgraphs of an aspect model (with regard to structure and content); i.e., the one pattern checking function for all subgraphs of the aspect model checks whether they match (with regard to structure or content) the provided pattern, and in the event of a match this subgraph is provided as recognized.

A corresponding set of subelements of the target format is associated with each pattern. For the generation operation, all patterns for the particular target format are run through, each pattern is applied to the output aspect model, and the subgraph of the aspect model resulting from the pattern recognition is mapped onto the subsets of the target format. Lastly, all subsets are combined to obtain the result.

For example, for the automatic generation of an aspect agent that is to be coupled to a blast furnace, it may be provided that the access addresses of the output interfaces are generated, so that in addition to the complete retrieval of all data points described in the associated aspect model, an individual retrieval of the individual data points is also made possible by this data-consuming application.

For this purpose, paths of the access address are generated as follows: The generation encompasses the establishment of a pattern, application to the particular aspect model, and mapping onto path elements, as follows:

Each represented data point results in a path element having the name of the data point. If a represented data point is part of a data point group, the corresponding path element is the successor of that path element which is associated with this data point group.

This takes place within the characteristic subgraph that is predefined by the metamodel.

Application to the aspect model illustrated by way of example in conjunction with FIG. 6 results in the following paths for the output interface of the aspect agent:

/operating data/temperature/internal
/operating data/temperature/external
/operating data/power consumption (In this regard, "/operating data" is assumed as the general access address for retrieving all data points described by the aspect model.)

In order for the two presented methods to be implementable, the hierarchical structure of the metamodel and following the rules of the metamodel by the particular aspect model are important. In addition, it is necessary to describe the semantics, going beyond the structure of the data, in the form of characteristics which as model elements are an inherent component of an aspect model. Mapping functions of aspect model elements or subgraphs of the aspect model for the particular target format must be able not only to reference the semantics of the particular model elements predefined by the metamodel, but also to evaluate the inheritance hierarchies of the referenced metamodel elements. This is necessary for generating program code for evaluation functions, in which the inheritance hierarchy may also be utilized in order to achieve, where necessary, analogous structures in generated classes. It is likewise necessary for generating other formats in which only the inheritance ensures the degree of decoupling of the generated structures, which is effectively necessary for utilizing same.

In a further aspect, the present invention relates to an information processing system, including data integration device 10 described above and at least one connected device $20a, \ldots, 20d$.

It may be provided that connected device $20a, \ldots, 20d$ is a sensor and/or an ERP system and/or a production machine and/or a robot and/or a vehicle and/or a charging station.

In addition, an information processing system including data integration device 10 may be provided, including a terminal $30a \ldots c$ for processing data that are provided to output interface $3a \ldots k$ to which terminal $30a \ldots c$ is connected.

Furthermore, an information processing system including the data integration device may be provided, including an evaluation function for processing the data provided at output interface $3a \ldots k$, the evaluation function being generated using aspect model $AM_1$, $AM_2$ of aspect processing device $1a \ldots k$ associated with output interface $3a \ldots k$.

Moreover, an information processing system may be provided, the evaluation function being parameterized using aspect model $AM_1$, $AM_2$ of aspect processing device $1a \ldots k$ associated with output interface $3a \ldots k$.

In addition, an information processing system may be provided, terminal $30a \ldots c$ being configured to use a description that is generated using an aspect model $AM_1$, $AM_2$.

It may be provided that the description includes a semantic description in an ontology format or logic format.

It may be provided that terminal $30a \ldots c$ includes a knowledge graph, and terminal $30a \ldots c$ being configured to integrate the data provided at an output interface $30a \ldots c$ by associated aspect processing device $1a \ldots k$, as well as associated aspect models $AM_1$, $AM_2$, into the knowledge graph.

Furthermore, an information processing system may be provided in which terminal 30 holds a description ready that describes semantics of one of the aspect models $AM_1$, $AM_2$, this description being generated with the aid of particular aspect model $AM_1$, $AM_2$.

It may be provided that the description contains a structure of the data provided by aspect processing device $1a \ldots k$ at its output interface $3a \ldots k$.

Moreover, an information processing system may be provided in which the generation includes traversing the graph of aspect model $AM_1$, $AM_2$.

It may be provided that the generation includes applying a mapping function, which generates a corresponding subelement of the evaluation function or description from an element of aspect model $AM_1$, $AM_2$, taking semantics of the metamodel into account.

It may be further provided that the corresponding subelement of the evaluation function is a class, or a function that may be called up.

In addition, an information processing system may be provided in which the generation involves providing at least one pattern for identifying subgraphs of the graph of aspect model $AM_1$, $AM_2$.

LIST OF REFERENCE NUMERALS $1a \ldots 1k$ aspect processing device, aspect agent
$2a \ldots 2d$ device
$3a \ldots 3k$ output interface
10 data integration device
11 registry
12 identifier (of the device to be coupled)
13 access address for digital twin
14 digital twin
$15a$, $d$ reference to aspect agent
20 device
$20a \ldots d$ device
30 terminal
$30a \ldots c$ terminal

What is claimed is:

1. A data integration device comprising:
   a hardware processing device that includes a plurality of input interfaces and a plurality of aspect processing devices that each is associated with at least one respective one of the plurality of input interfaces; and
   a registry of references to respective digital twins that are each registered to a respective one of a plurality of external devices;
   wherein:
      with respect to each of the plurality of input interfaces:
         a respective one of the external devices is connectable to the respective input interface for delivery, by the respective external device, of respective runtime data to the respective input interface; and
         the runtime data of the respective device that is connectable to the respective input interface is characterized for the respective input interface using at least one aspect model that each is associated with the respective input interface and that each characterizes an aspect of the respective runtime data; and
         each of the digital twins includes a reference to the respective aspect processing device to which the respective input interface to which the respective external device of the digital twin is connectable, is connected.

2. The data integration device as recited in claim 1, wherein each respective aspect model is set up according to rules that are defined in a respective metamodel.

3. The data integration device as recited in claim 1, wherein each of the aspect processing devices includes a respective output interface.

4. The data integration device as recited in claim 3, wherein each of the aspect processing devices is configured to provide, at the respective output interface of the respective aspect processing device, a portion of the respective runtime data provided to the respective input interface with which the respective aspect processing device is associated.

5. The data integration device as recited in claim 4, wherein the provided portion of the runtime data provided at the respective output interface is contained in an aspect of the runtime data which is characterized by the respective aspect model which is associated with the respective aspect processing device to which the respective output interface belongs.

6. The data integration device as recited in claim 5, wherein the provided portion of the runtime data provided at the respective output interface includes all those runtime data which are characterized by the respective aspect model which is associated with the respective aspect processing device to which the respective output interface belongs.

7. The data integration device as recited in claim 1, wherein a plurality of the input interfaces are associated with a same one of the aspect models.

8. The data integration device as recited in claim 1, wherein each of the aspect models is structured as a directed graph that includes nodes identifying individual data points and/or groups of data points.

9. The data integration device as recited in claim 8, wherein each of the aspect models is set up according to rules that are defined in a respective metamodel.

10. A data integration device comprising:
    a hardware processing device that includes a plurality of input interfaces;
    wherein:
       with respect to each of the plurality of input interfaces:
          a respective external device is connectable to the respective input interface for delivery, by the respective external device, of respective runtime data to the respective input interface; and
          the runtime data of the respective device that is connectable to the respective input interface is characterized for the respective input interface using at least one aspect model that each:
             is associated with the respective input interface;
             characterizes an aspect of the respective runtime data; and
             is structured as a directed graph that includes nodes identifying individual data points and/or groups of data points.

11. The data integration device as recited in claim 10, wherein each of the input interfaces is connected to each of at least one respective aspect processing device with which is associated the respective aspect model that is associated with the respective input interface.

12. The data integration device as recited in claim 11, wherein each of the aspect processing devices includes a respective output interface.

13. The data integration device as recited in claim 12, wherein each of the aspect processing devices is configured to provide, at the respective output interface of the respective aspect processing device, a portion of the respective runtime data provided to the respective input interface with which the respective aspect processing device is associated.

14. The data integration device as recited in claim 13, wherein the provided portion of the runtime data provided at the respective output interface is contained in an aspect of the runtime data which is characterized by the respective aspect model which is associated with the respective aspect processing device to which the respective output interface belongs.

15. The data integration device as recited in claim 14, wherein the provided portion of the runtime data provided at the respective output interface includes all those runtime data which are characterized by the respective aspect model which is associated with the respective aspect processing device to which the respective output interface belongs.

16. The data integration device as recited in claim 11, further comprising:
a registry in which a reference to a respective digital twin is registered for each connected one of the external devices.

17. The data integration device as recited in claim 10, wherein a plurality of the input interfaces are associated with a same one of the aspect models.

18. The data integration device as recited in claim 10, wherein the structure of each respective aspect model contains at least one subgraph that describes properties of the data points identified by the nodes and/or properties of the data points of the group identified by the nodes.

19. The data integration device as recited in claim 18, wherein at least one of the at least one subgraph is unambiguously reachable during traversal of the graph up to a predefinable node.

20. The data integration device as recited in claim 19, wherein the data integration device is configured to interpret data received from a connected device corresponding to the properties described in the at least one of the at least one subgraph.

21. The data integration device as recited in claim 19, wherein each of the aspect models is set up according to rules that are defined in a respective metamodel.

22. The data integration device as recited in claim 21, wherein properties established by the subgraph are predefined by the respective metamodel.

23. The data integration device as recited in claim 22, wherein the properties established by the subgraph are subdivided into classes, and the classes are predefined in a hierarchical structure of selectable classes.

24. The data integration device as recited in claim 10, wherein each of the aspect models is set up according to rules that are defined in a respective metamodel.

* * * * *